(12) United States Patent
Jia et al.

(10) Patent No.: US 12,340,854 B2
(45) Date of Patent: Jun. 24, 2025

(54) MULTILEVEL VOLTAGE DETECTOR CIRCUIT

(71) Applicant: Shanghai Huali Integrated Circuit Corporation, Shanghai (CN)

(72) Inventors: Yu Jia, Shanghai (CN); Yifei Qian, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 281 days.

(21) Appl. No.: 18/141,949

(22) Filed: May 1, 2023

(65) Prior Publication Data

US 2024/0120013 A1    Apr. 11, 2024

(30) Foreign Application Priority Data

Sep. 29, 2022  (CN) .......................... 202211198095.3

(51) Int. Cl.

| | |
|---|---|
| *G11C 17/16* | (2006.01) |
| *G01R 31/40* | (2020.01) |
| *G11C 17/18* | (2006.01) |
| *H10B 20/25* | (2023.01) |
| *G01R 19/00* | (2006.01) |
| *H02M 1/08* | (2006.01) |

(52) U.S. Cl.
CPC ............ *G11C 17/165* (2013.01); *G01R 31/40* (2013.01); *G11C 17/18* (2013.01); *H10B 20/25* (2023.02); *G01R 19/0084* (2013.01); *H02M 1/08* (2013.01)

(58) Field of Classification Search
CPC ... H01L 23/5256; G11C 17/165; G11C 17/18; H10B 20/25; G01R 19/0084; G01R 31/40; H02M 1/08
See application file for complete search history.

(56) References Cited

U.S. PATENT DOCUMENTS

| | | | |
|---|---|---|---|
| 11,812,531 B1 * | 11/2023 | Cho .................... | H05B 45/54 |
| 2021/0351193 A1 * | 11/2021 | Chang .................. | H10B 20/25 |
| 2023/0371247 A1 * | 11/2023 | Chang ................. | H01L 23/5256 |
| 2024/0297115 A1 * | 9/2024 | Chen .................... | H01L 23/5256 |

FOREIGN PATENT DOCUMENTS

| | | | | | |
|---|---|---|---|---|---|
| CN | 1312616 | A | * | 9/2001 | ............ H03M 1/682 |
| CN | 117713752 | A | * | 3/2024 | ............ H03K 3/011 |
| CN | 114126165 | B | * | 3/2025 | ............ H05B 47/12 |

* cited by examiner

*Primary Examiner* — Christopher E Mahoney
(74) *Attorney, Agent, or Firm* — Banner & Witcoff, Ltd.

(57) ABSTRACT

The present application discloses a multi-level voltage detector circuit. The voltage dividing circuit includes a first resistor string and a second circuit. The first resistor string is formed by n+1 voltage dividing resistors connected in series and outputs n divisional voltages. The second circuit provides n lower voltage dividing resistors. A kth lower voltage dividing resistor detects kth rise and fall detection points of a power supply voltage. When the kth rise detection point is detected, the second circuit provides a kth lower voltage dividing resistor and short-circuits the kth lower voltage dividing resistor. When the kth fall detection point is detected, the second circuit provides the kth lower voltage dividing resistor to a position between a second end of an nth voltage dividing resistor and the ground. As the value of k increases, the resistance of the kth lower voltage dividing resistor decreases.

10 Claims, 4 Drawing Sheets

MULTILEVEL VOLTAGE DETECTOR CIRCUIT

CROSS-REFERENCES TO RELATED APPLICATIONS

This application claims the priority to Chinese patent application No. CN 202211198095.3, filed on Sep. 29, 2022, and entitled "MULTILEVEL VOLTAGE DETECTOR CIRCUIT", the disclosure of which is incorporated herein by reference in its entirety.

TECHNICAL FIELD

The present application relates to a semiconductor integrated circuit, in particular, to a multi-level voltage detector circuit.

BACKGROUND

Voltage Detector (VD) is usually used for detecting the power supply voltage in a Micro Control Unit (MCU). When the power supply voltage is less than a set value, an interrupt signal is generated to a System-On-Chip (SOC). A resistor string is usually used in the voltage detector to divide the voltage to reflect the change of the power supply voltage. The divisional voltage value of the resistor string is compared with a reference voltage provided by a bandgap reference source through a comparator to generate an output signal which is provided to the system.

In the design, voltage detection points can be adjusted by changing the ratio of the resistances of the resistors of the resistor string. The voltage detection points include rise and fall detection points. There is a certain voltage difference between the voltage detection points, which is called voltage window. The existence of the voltage window can prevent the output from being reversed repeatedly due to the fluctuation of the power supply voltage, which affects the normal operation of the system.

Referring to FIG. 1, it illustrates a circuit diagram of a resistor string in an existing single-level voltage detector circuit. The resistor string includes a resistor R100, a resistor R101 and a resistor R102 connected in series. A drain of an NMOS transistor NM101 is connected to a first end of the resistor R102 and a second end of the resistor R101. A source of the NMOS transistor NM101 is connected to a second end of the resistor R102 and the ground. A gate of the NMOS transistor NM101 is connected to a feedback voltage VFB. The first end of the resistor R100 is connected to a power supply voltage VDD. A second end of the resistor R100 is connected to a first end of the resistor R101 and outputs a divisional voltage V1.

Referring to FIG. 2, it illustrates a circuit diagram of a feedback voltage generation circuit in the existing single-level voltage detector circuit. The feedback voltage generation circuit includes a comparator 101 and a phase inverter 102. The feedback voltage generation circuit in FIG. 2 further includes a logic circuit 103.

In FIG. 2, the comparator 101 is represented by "comparator", the phase inverter 102 is represented by "INV", and the logic circuit 103 is represented by "logic". The logic circuit 103 will form an output signal VOUT which is provided to the SOC. A positive-phase input end of the comparator 101 is connected to a divisional voltage V1. A negative-phase input end is connected to a reference voltage VBGL. In FIG. 2, the positive-phase input end of the comparator 101 is represented by "+", and the negative-phase input end is represented by "−". When the voltage of the positive-phase input end is more than the voltage of the negative-phase input end, an output signal of the comparator is at high-level, and vice versa. The reference voltage VBGL is provided by a bandgap reference source. It can be seen that the power supply voltage VDD gradually increases from low to high in the power-on process. Before increasing to the rise detection point, the divisional voltage V1 is lower than the reference voltage VBGL, so the output signal of the comparator 101 is at low-level, and a feedback voltage VFB obtained after phase inversion by the phase inverter 102 is at high-level. At this time, since the gate voltage of the NMOS transistor NM101 is at high-level, the NMOS transistor NM101 will remain on, so a resistor R102 is short-circuited. Therefore, the resistor R102 is also called short-circuited resistor. At this time, the divisional voltage V1 is determined by resistors R100 and R101. When the divisional voltage V1 exceeds a rise detection point, the output signal of the comparator 101 will be reversed, and the feedback voltage VFB will be switched to a low level. In this way, the NMOS transistor NM101 is turned off, and the resistor R102 is no longer short-circuited, but will be connected in series with the resistors R100 and R102 and participate in dividing the voltage.

When the power supply voltage VDD gradually decreases from high to low, before it decreases to a fall detection point, the divisional voltage V1 will be more than the reference voltage VBGL, the VFB will remain at a low level, the NMOS transistor NM101 will remain off, and the resistor R102 will remain connected in series with the resistors R100 and R102 and participate in dividing the voltage. When the power supply voltage VDD decreases to less than or equal to the fall detection point, the VFB will be reversed and become a high-level, the NMOS transistor NM101 will be turned on, and the resistor R102 will be short-circuited. The fall detection point needs to be set to be less than the rise detection point. There is a certain voltage difference between the rise and fall detection points, which is called voltage window. The existence of the voltage window can prevent the output from being reversed repeatedly due to the fluctuation of the power supply voltage, which affects the normal operation of the system.

When the power supply voltage VDD is just on, the output of the comparator 206 is low, the feedback voltage VFB is high, the NMOS transistor NM101 is turned on, and the resistor R102 is short-circuited. At this time, the resistors R100 and R101 participate in dividing the voltage, and the calculation formula of the divisional voltage V1 is:

$$V1 = VDD1 * R101/(R101+R100) \tag{1}$$

where VDD1 represents voltage rise detection point.

When the power supply voltage VDD exceeds the voltage rise detection point VDD1, the divisional voltage V1 is more than the reference voltage VBGL, the output of the comparator 101 is reversed to high, and the feedback voltage VFB is low. At this time, the NMOS transistor NM101 is cut off, and the resistor R102 participates in dividing the voltage. The calculation formula of the divisional voltage becomes:

$$V1 = VDD2 * (R102+R101)/(R102+R101+R100) \tag{2}$$

where VDD2 represents voltage fall detection point.

Since the reference voltage for comparison, i.e., the reference voltage VBGL, is fixed, V1 is equal. Since (R102+R101)/(R102+R101+R100)>R101/(R101+R100), by comparing formulas (1) and (2), it can be seen that VDD1>VDD2.

$$VDD1-VDD2=VBGL*[R100/R101-R100/(R102+R101)] \quad (3)$$

Formula (3) is the calculation formula of the voltage window.

In practical use, the voltage detector needs to provide a multi-level voltage detector function to meet the requirements of different operating voltage ranges of different modules.

Taking an 8-level voltage detector as an example, the detection voltage rises with the rise of the level. Referring to FIG. 3, it illustrates a circuit diagram of a resistor string of an existing multi-level voltage detector circuit. In FIG. 3, there are altogether 8 levels of divisional voltages, which are represented by V1 to V8 respectively. The resistor string forming the divisional voltages V1-V8 includes resistors R200, 201 to 208 and 209. A first end of the resistor R200 is connected to a power supply voltage VDD25. The two ends of the resistor R209 are connected to a drain and a source of an NMOS transistor NM201, and a gate of the NMOS transistor NM201 is connected to a feedback voltage VFB.

Multiple groups of voltage detection points are designed by adjusting the ratio on the resistance of the resistors of the resistor string. The divisional voltages V1-V8 will be selected through a multiplexer (MUX) gating module. Then, also referring to FIG. 2, the selected divisional voltage is compared with the reference voltage VBGL to realize the adjustable-level voltage detector function.

However, in the existing structure in FIG. 3, only one resistor R209 is used to realize the window adjustment, and the resistor R209 will be short-circuited during detection at the rise detection point of each level. Since the ratio of the resistance of the resistors participating in dividing the voltage at each level is different, the voltage window value will produce a deviation of more than 100% at normal temperature and normal pressure.

In addition, as the levels become more and the detection voltage range becomes larger, the error will be greater. This deviation will cause overlap and conflict between the voltage rise and fall detection points at different levels.

BRIEF SUMMARY

According to some embodiments in this application, a multi-level voltage detector circuit includes a voltage dividing circuit and the voltage dividing circuit is used for outputting n levels of divisional voltages of a power supply voltage;

the voltage dividing circuit includes a first resistor string and a second circuit;

the first resistor string is formed by n+1 voltage dividing resistors connected in series, a first end of a zeroth voltage dividing resistor is connected to the power supply voltage, a first end of a kth voltage dividing resistor is connected to a second end of an (k−1)th voltage dividing resistor, and the first end of the kth voltage dividing resistor outputs a kth divisional voltage, 1≤k≤n; a second end of an nth voltage dividing resistor is connected to the second circuit;

the second circuit provides n lower voltage dividing resistors;

the kth lower voltage dividing resistor is used for detecting a kth rise detection point and a kth fall detection point of the power supply voltage, the kth fall detection point is less than the kth rise detection point, and a difference between the kth rise detection point and the kth fall detection point is a kth voltage window;

when the kth rise detection point is detected, the second circuit provides a kth lower voltage dividing resistor and short-circuits the kth lower voltage dividing resistor;

when the kth fall detection point is detected, the second circuit provides the kth lower voltage dividing resistor to a position between the second end of the nth voltage dividing resistor and the ground; as the value of k increases, the resistance of the kth lower voltage dividing resistor decreases, so that a voltage window of each divisional voltage is fixed.

In some cases, the second circuit includes a switch network, the second circuit uses the switch network to select the kth lower voltage dividing resistor to be provided and set an electrical connection structure of the kth lower voltage dividing resistor.

In some cases, the second circuit further includes a second resistor string formed by n second resistors connected in series;

a first end of a first second resistor is connected to the second end of the nth voltage dividing resistor;

a first end of an mth second resistor is connected to a second end of an (m−1)th second resistor, 1≤m≤n;

a second end of an nth second resistor is connected to the ground;

the resistance of a kth lower voltage dividing resistor is the sum of the resistance of a kth second resistor to the nth second resistor.

In some cases, the switch network includes n switches and controls each switch through an n-bit control signal;

a kth switch is connected between a first end of the kth second resistor and the ground;

the kth switch is controlled through a (k−1)th-bit control signal;

when the second circuit selects the kth lower voltage dividing resistor, first to (k−1)th switches and (k+1)th to nth switches are turned off;

when the kth rise detection point is detected, the kth switch is turned on, and the first to (k−1)th switches and the (k+1)th to nth switches are turned off;

when the kth fall detection point is detected, the n switches are all turned off.

In some cases, all switches are NMOS transistor switches or PMOS transistor switches.

In some cases, the multi-level voltage detector circuit further includes a multiplexer and a comparator;

the multiplexer includes at least n input ends, each divisional voltage is connected to one input end of the multiplexer, and an output end of the multiplexer outputs the selected divisional voltage;

a first input end of the comparator is connected to the output end of the multiplexer;

a second input end of the comparator is connected to a reference voltage;

an output end of the comparator outputs a first feedback signal.

In some cases, the first input end of the comparator is a positive-phase input end and the second input end of the comparator is a negative-phase input end;

the output end of the comparator is further connected to an input end of a phase inverter, and an output end of the phase inverter outputs a second feedback signal.

In some cases, the multi-level voltage detector circuit further includes a decoder, an input end of the decoder is connected to an externally input control code, an output end of the decoder outputs an n-bit selection signal, the n-bit control signal is obtained by performing a logic operation on the n-bit selection signal and the first feedback signal or the second feedback signal.

In some cases, when all switches are NMOS switches, in a case that the kth lower voltage dividing resistor is selected, a kth-bit selection signal in the n-bit selection signal is 1, first-bit to (k−1)th-bit and (k+1)th-bit to nth-bit selection signals are all 0;

the n-bit control signal is obtained by performing logic multiplication on the n-bit selection signal and the second feedback signal.

In some cases, when all switches are PMOS switches, in a case that the kth lower voltage dividing resistor is selected, the kth-bit selection signal in the n-bit selection signal is 0, first-bit to (k−1)th-bit and (k+1)th-bit to nth-bit selection signals are all 1; the n-bit control signal is obtained by performing logic addition on the n-bit selection signal and the first feedback signal.

Different from the coexisting technology in which the lower voltage dividing resistors of the same size are applied, the present application can provide a lower voltage dividing resistor for each level of divisional voltage separately. For example, the kth lower voltage dividing resistor can be provided separately for the kth divisional voltage, so that the size of the kth lower voltage dividing resistor can fully meet the requirements of the rise and fall detection points of the kth divisional voltage. Therefore, the kth lower voltage dividing resistor can be finely adjusted to achieve fine adjustment of the kth rise detection point and the kth fall detection point. In this way, the kth voltage window formed by the difference between the kth rise detection point and the kth fall detection point can also be adjusted. Finally, the voltage window of each divisional voltage can be fixed. For example, the error of the rise and fall detection points of each divisional voltage can be controlled within 1%.

Each lower voltage dividing resistor of the present application can be realized by forming a second resistor string consisting of n second resistors and combining with a switch network. Compared with the existing single lower voltage dividing resistor, the second resistor string in the present application can divide the existing single lower voltage dividing resistor on the basis of the existing single lower voltage dividing resistor according to the difference between the lower voltage dividing resistors at adjacent levels, that is, the kth second resistor can be obtained through the difference between the kth lower voltage dividing resistor and the (k+1)th lower voltage dividing resistor. For example, a first second resistor can be obtained through a difference between a first lower voltage dividing resistor and a second lower voltage dividing resistor, and a second resistor can be obtained through a difference between the second lower voltage dividing resistor and a third lower voltage dividing resistor, so that the resistance of the second resistor string in the present application can be the same as the resistance of the existing single lower voltage dividing resistor. Therefore, the present application can also realize the maximum utilization of the resistors by arranging the resistors in series by difference, thus reducing the area and cost of the circuit.

The circuit provided by the present application is expandable and can be applied to multiple platforms.

The second circuit in the present application, such as the second circuit including the switch network and the second resistor string, can not only be applied to voltage detectors that require level adjustment setting and detection voltage range setting, but also can be widely applied to voltage detectors with different requirements.

BRIEF DESCRIPTION OF THE DRAWINGS

The present application will be further described in detail below in combination with the specific embodiments with reference to the drawings.

DETAILED DESCRIPTION OF THE APPLICATION

Figure 1:
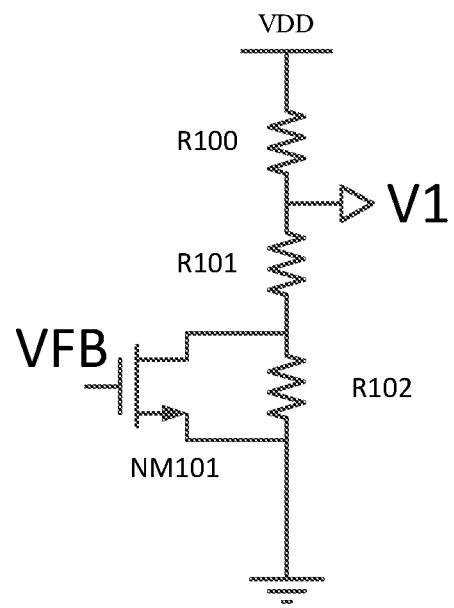
FIG. 1 illustrates a circuit diagram of a resistor string in an existing single-level voltage detector circuit.
Figure 2:
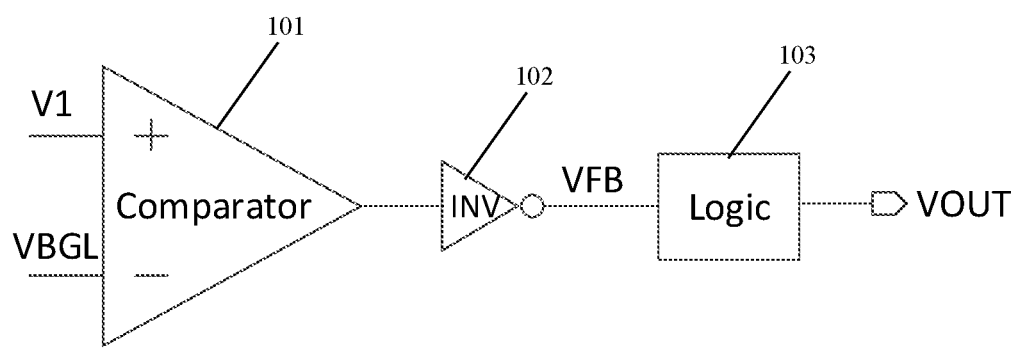
FIG. 2 illustrates a circuit diagram of a feedback voltage generation circuit in an existing single-level voltage detector circuit.
Figure 3:
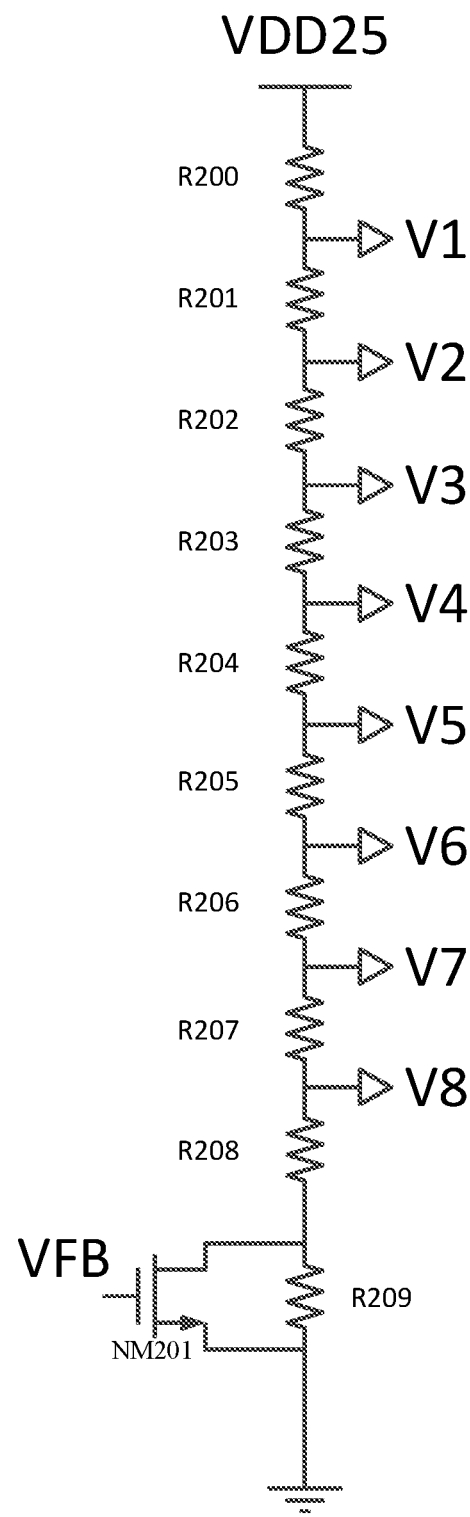
FIG. 3 illustrates a circuit diagram of a resistor string in an existing multi-level voltage detector circuit.
Figure 4:
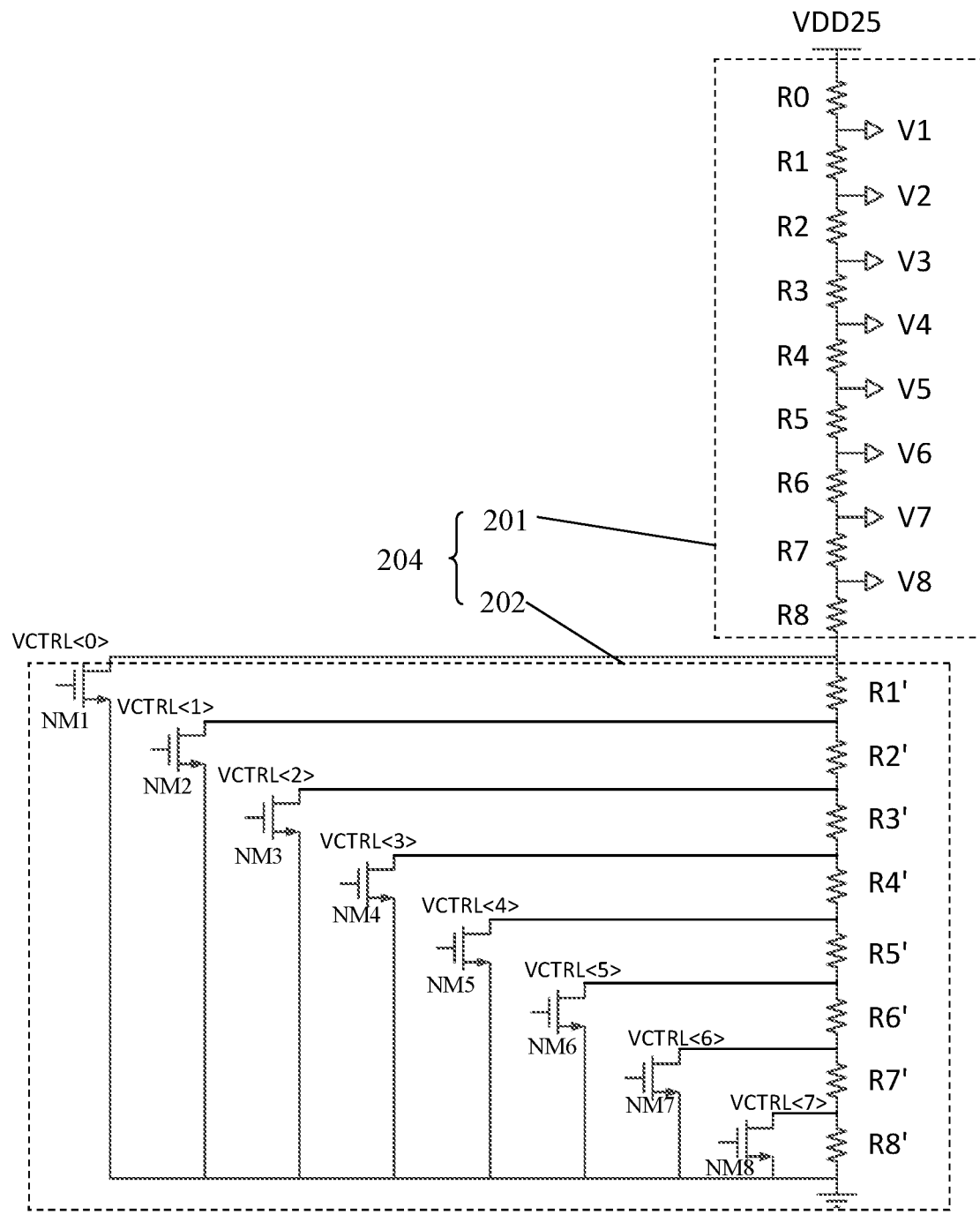
FIG. 4 illustrates a circuit diagram of a resistor string in a multi-level voltage detector circuit according to an embodiment of the present application.
Figure 5:
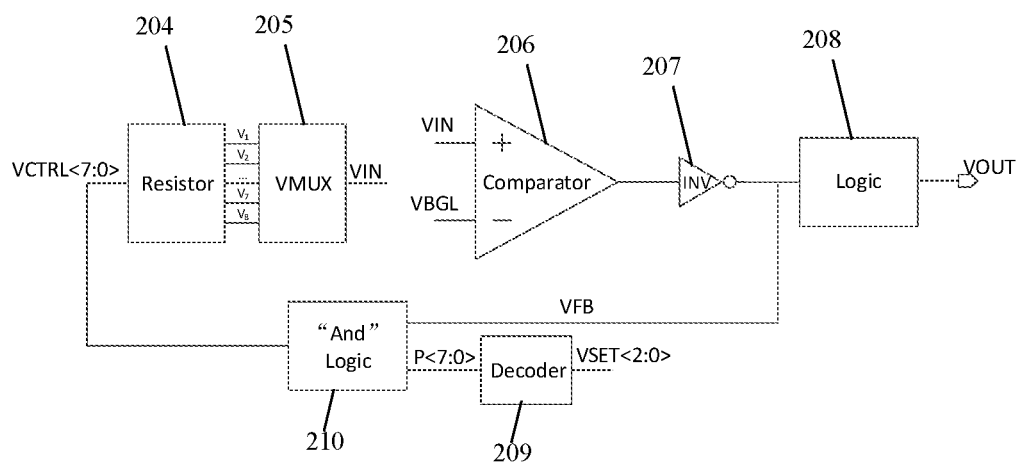
FIG. 5 illustrates a structural diagram of a multi-level voltage detector circuit according to an embodiment of the present application.

Referring to FIG. 4, it illustrates a circuit diagram of a resistor string of a multi-level voltage detector circuit according to an embodiment of the present application. Referring to FIG. 5, it illustrates a structural diagram of a multi-level voltage detector circuit according to an embodiment of the present application. The multi-level voltage detector circuit according to the embodiment of the present application includes a voltage dividing circuit 204. The voltage dividing circuit 204 is used for outputting n levels of divisional voltages of a power supply voltage VDD25. For the convenience of understanding and comparison with FIG. 3, FIG. 4 illustrates only a preferred example in a case of n=8. Eight levels of output divisional voltages are V1 and V2 to V8 respectively. In other embodiments, n is not limited to 8.

The voltage dividing circuit 204 includes a first resistor string 201 and a second circuit 202.

The first resistor string 201 is formed by n+1 voltage dividing resistors connected in series. A first end of a zeroth voltage dividing resistor is connected to the power supply voltage VDD25. A first end of a kth voltage dividing resistor is connected to a second end of an (k−1)th voltage dividing resistor. The first end of the kth voltage dividing resistor outputs a kth divisional voltage, $1 \leq k \leq n$. A second end of an nth voltage dividing resistor is connected to the second circuit 202. The second circuit 202 provides n lower voltage dividing resistors. The kth lower voltage dividing resistor is used for detecting a kth rise detection point and a kth fall detection point of the power supply voltage VDD25. The kth fall detection point is less than the kth rise detection point. A difference between the kth rise detection point and the kth fall detection point is a kth voltage window. FIG. 4 illustrates nine voltage dividing resistors when n=8. The nine voltage dividing resistors are respectively represented by R0 and R1 to R8.

When the kth rise detection point is detected, the second circuit 202 provides a kth lower voltage dividing resistor and short-circuits the kth lower voltage dividing resistor.

When the kth fall detection point is detected, the second circuit 202 provides the kth lower voltage dividing resistor to a position between the second end of the nth voltage dividing resistor and the ground; as the value of k increases, the resistance of the kth lower voltage dividing resistor decreases, so that a voltage window of each divisional voltage is fixed.

In the embodiment of the present application, the second circuit 202 includes a switch network. The second circuit 202 uses the switch network to select the kth lower voltage dividing resistor to be provided and set an electrical connection structure of the kth lower voltage dividing resistor.

The second circuit 202 further includes a second resistor string formed by n second resistors connected in series. FIG. 4 illustrates eight second resistors, which are respectively represented by R1' and R2' to R8'.

A first end of a first second resistor R1' is connected to the second end of the nth voltage dividing resistor.

A first end of an mth second resistor is connected to a second end of an (m−1)th second resistor, 1≤m≤n.

A second end of an nth second resistor is connected to the ground.

The resistance of a kth lower voltage dividing resistor is the sum of the resistance of a kth second resistor to the nth second resistor.

For example, in FIG. 4, the resistance of the first lower voltage dividing resistor is the sum of the resistance of the second resistors R1' and R2' to R8'.

The switch network includes n switches and controls each switch through an n-bit control signal.

A kth switch is connected between a first end of the kth second resistor and the ground.

The kth switch is controlled through a (k−1)th-bit control signal.

When the second circuit 202 selects the kth lower voltage dividing resistor, first to (k−1)th switches and (k+1)th to nth switches are turned off.

When the kth rise detection point is detected, the kth switch is turned on, and the first to (k−1)th switches and the (k+1)th to nth switches are turned off.

When the kth fall detection point is detected, the n switches are all turned off.

In the embodiment of the present application, all switches are NMOS transistor switches. The eight NMOS transistor switches in FIG. 4 are represented by NM1 and NM2-NM8 respectively. In other embodiments, all switches may be PMOS transistor switches.

Referring to FIG. 5, the multi-level voltage detector circuit further includes a multiplexer 205 and a comparator 206. Since the voltage dividing circuit 204 is realized by a resistor string, the voltage dividing circuit 204 in FIG. 5 is also represented by a "Resistor". In FIG. 5, the multiplexer 205 is also represented by MUX, and the comparator 206 is represented by "Comparator".

The multiplexer 205 includes at least n input ends. Each divisional voltage is connected to one input end of the multiplexer 205. An output end of the multiplexer 205 outputs the selected divisional voltage. In FIG. 5, the divisional voltage output by the output end of the multiplexer 205 is represented by voltage VIN.

A first input end of the comparator 206 is connected to the output end of the multiplexer 205.

A second input end of the comparator 206 is connected to a reference voltage VBGL.

An output end of the comparator 205 outputs a first feedback signal.

In the embodiment of the present application, the first input end of the comparator 206 is a positive-phase input end and the second input end of the comparator 206 is a negative-phase input end. In FIG. 5, the positive-phase input end of the comparator 206 is represented by "+", and the negative-phase input end is represented by "−".

The output end of the comparator 206 is further connected to an input end of a phase inverter 207, and an output end of the phase inverter 207 outputs a second feedback signal VFB. In FIG. 5, the phase inverter 207 is further represented by INV.

The second circuit 202 further includes a decoder 209. An input end of the decoder 209 is connected to an externally input control code. An output end of the decoder 209 outputs an n-bit selection signal. The n-bit control signal is obtained by performing a logic operation on the n-bit selection signal and the first feedback signal or the second feedback signal VFB.

In the embodiment of the present application, when all switches are NMOS switches, in a case that the kth lower voltage dividing resistor is selected, a kth-bit selection signal in the n-bit selection signal is 1, first-bit to (k−1)th-bit and (k+1)th-bit to nth-bit selection signals are all 0. The n-bit control signal is obtained by performing logic multiplication on the n-bit selection signal and the second feedback signal VFB. In FIG. 5, the decoder 209 is represented by "Decoder", the logic multiplication is realized by adopting a logic AND circuit 210, and the logic AND circuit 210 is represented by "And" Logic. The control code is represented by VSET<2:0>. Since n is equal to 8, it is only necessary to use a 3-bit control code. The n-bit selection signal is represented by P<7:0>, and the n-bit control signal is represented by VCTRL<7:0>. In FIG. 4, each bit signal of the n-bit control signal is represented by VCTRL<0> and VCTRL<1> to VCTRL<7>.

In other embodiments, when all switches are PMOS switches, in a case that the kth lower voltage dividing resistor is selected, the kth-bit selection signal in the n-bit selection signal is 0, first-bit to (k−1)th-bit and (k+1)th-bit to nth-bit selection signals are all 1; the n-bit control signal is obtained by performing logic addition on the n-bit selection signal and the first feedback signal.

Referring to FIG. 5, the output end of the phase inverter 207 is connected to the logic circuit 208, the logic circuit 208 processes the second feedback signal VFB and outputs a divisional voltage logic output signal VOUT. The divisional voltage logic output signal VOUT is usually output to the system such as system-on-chip.

In the embodiment of the present application corresponding to FIG. 4, a second resistor string structure is adopted in the second circuit 202. In this structure, with the increase of the level, the number of the lower voltage dividing resistors will gradually decrease. At the same time, the part of the second resistor string that is not short-circuited will act as part of the resistor R8. For example, when the rise detection point of the second divisional voltage V2, i.e., the second rise detection point, is detected, the resistors R2' and R3' to R8' will be short-circuited, and the resistor R1' will be combined into the resistor R8, which is equivalent to increasing the sum of the resistance of the resistors connected in series at the bottom of the second divisional voltage V2. Compared with the situation that the resistor R1' is not combined into the resistor R8, the second rise detection point will decrease. Moreover, with the increase of the level, the number of the resistors that are not short-circuited in the second resistor string and are combined into the resistor R8 will increase. In this way, compared with the situation that the resistors not short-circuited in the second resistor string are not combined into the resistor R8, the rise detection point will decrease and the difference between the two will increase with the increase of the level, so that the gradual adjustment of the rise detection point can be realized, and finally the voltage window of each level will be fixed. However, in the existing resistor string illustrated in FIG. 3, with the increase of the level, when the rise detection point corresponding to the divisional voltage is detected, the resistor string at the top will continue to increase and the resistor string at the bottom will continue to decrease. For example, when the second rise detection point corresponding to the divisional voltage V2 is detected, the resistor string at the top of divisional voltage V2 includes resistors R200 and R201, and the resistor string at the bottom includes resistors R202 and R203 to R208. When the third detection point corresponding to the divisional voltage V3 is detected, the resistor string at the top of the divisional voltage V3 includes resistors R200, R201 and R202, and the resistor string at the bottom includes resistors R203 and R204 to R208. Therefore, the third detection point will have a greater increase than the second detection point, and there is no adjustment means. In FIG. 4, when the sum of the resistance of the second resistors R1' and R2' to R8' is equal to the resistance of the resistor R209 in FIG. 3, the change of each fall detection point in the embodiment of the present application is the same as that in FIG. 3.

It can be seen that in the embodiment of the present application, under the situation that the total resistance of the second resistors R1' and R2' to R8' is equal to the resistance of the lower voltage dividing resistor R209 in FIG. 3, the rise detection point can be adjusted accurately and thus the voltage window can be fixed. Since the total resistance required for realizing the circuit resistance is the same, the embodiment of the present application does not need to increase the resistor cost.

In other embodiments, the number of the lower voltage dividing resistors may also gradually decrease with the increase of the level. At the same time, in the detection process of the fall detection point, the part not short-circuited in the second resistor string will not act as part of the resistor R8. In the detection process of the rise detection point, it acts as or does not act as part of the resistor R8. The connection relationship of the part not short-circuited in the second resistor string can be realized by increasing the control of the switch circuit or by changing the second resistor string, such as by using multiple parallel second resistor strings of different sizes. Taking the detection of the fall detection point as an example, during the detection of the fall detection point, the lower voltage dividing resistors will be directly connected in series to the second end of the resistor R8. With the increase of the level, the number of the lower voltage dividing resistors will decrease, the number of the resistors connected in series at the bottom of the resistor R8 will also decrease, and the voltage at the fall detection point will increase. That is, compared with the circuit illustrated in FIG. 3, the voltage at the fall detection point will increase, so that on the basis of the existing circuit illustrated in FIG. 3, the fall detection point is adjustable, so that the voltage window can be fixed.

Different from the existing technology in which lower voltage dividing resistors of the same size are used for the divisional voltage of each level, the embodiment of the present application can provide the lower voltage dividing resistor separately for the divisional voltage of each level. For example, the kth lower voltage dividing resistor can be provided separately for the kth divisional voltage, so that the size of the kth lower voltage dividing resistor can fully meet the requirements of the rise and fall detection points of the kth divisional voltage. Therefore, the kth lower voltage dividing resistor can be finely adjusted to achieve fine adjustment of the kth rise detection point and the kth fall detection point. In this way, the kth voltage window formed by the difference between the kth rise detection point and the kth fall detection point can also be adjusted. Finally, the voltage window of each divisional voltage can be fixed. For example, the error of the rise and fall detection points of each divisional voltage can be controlled within 1%.

Each lower voltage dividing resistor of the embodiment of the present application can be realized by forming a second resistor string consisting of n second resistors and combining with a switch network. Compared with the existing single lower voltage dividing resistor, the second resistor string in the embodiment of the present application can divide the existing single lower voltage dividing resistor on the basis of the existing single lower voltage dividing resistor according to the difference between the lower voltage dividing resistors at adjacent levels, that is, the kth second resistor can be obtained through the difference between the kth lower voltage dividing resistor and the (k+1)th lower voltage dividing resistor. For example, a first second resistor can be obtained through the difference between a first lower voltage dividing resistor and a second lower voltage dividing resistor, and a second resistor can be obtained through a difference between the second lower voltage dividing resistor and a third lower voltage dividing resistor, so that the resistance of the second resistor string in the embodiment of the present application can be the same as the resistance of the existing single lower voltage dividing resistor. Therefore, the embodiment of the present application can also realize the maximum utilization of the resistors by arranging the resistors in series by difference, thus reducing the area and cost of the circuit.

The circuit provided by the embodiment of the present application is expandable and can be applied to multiple platforms.

The second circuit 202 in the embodiment of the present application, such as the second circuit 202 including the switch network and the second resistor string, can not only be applied to voltage detectors that require level adjustment setting and detection voltage range setting, but also can be widely applied to voltage detectors with different requirements.

Referring to FIG. 5, with the change of the control code, the corresponding lower voltage dividing resistors act.
External Input When it is a <000> signal, the lower voltage dividing resistors are R1'+R2'+R3'+ . . . +R8'; R1'+R2'+R3'+ . . . +R8' are short-circuited during the detection of the first rise detection point, and are conducted during the detection of the first fall detection point.

When it is a <001> signal, the lower voltage dividing resistors are R2'+R3'+ . . . +R8'; R2'+R3'+ . . . +R8' are short-circuited during the detection of the second rise detection point, and are conducted during the detection of the second fall detection point.

When it is a <110> signal, the lower voltage dividing resistors are R3'+ . . . +R8', and the number of the lower voltage dividing resistors at other levels can be reduced gradually by analogy. When it is a <111> signal, the lower voltage dividing resistor is R8'.

FIG. 5 illustrates an overall structure of a voltage detector. A VCTRL<7:0> control signal is generated after an input three-bit control signal is processed by the decoder 209 and then is subjected to an "AND logic operation" (F=A·B) with the second feedback signal VFB, and no additional control pin (PIN) is generated.

For example, when the external input is a <000> code, a first selection signal P<0> is processed as 1 by the decoder, a divisional voltage VIN output by the multiplexer 205 selects a divisional voltage V1, and the divisional voltage V1 is compared with the reference voltage VBGL at the negative-phase input end of the comparator 206 to form a first feedback signal. The first feedback signal is phase-inverted by the phase inverter 207 to form a second feedback signal VFB. Since P<0> is 1, the first-bit control signal VCTRL<0> is the product of P<0> and VFB and VCTRL<0> is equal to VFB. Therefore, when VFB is 1, VCTRL<0> outputs 1. At this time, the NMOS transistor NM1 is turned on, and the resistors R1'-R8' can be short-circuited. When VFB is 0, it outputs 0. The NMOS transistor NM1 is cut off, and the resistors R1' to R8' still participate in dividing the voltage. The "AND" operation makes the state of the NMOS transistor NM1 controlled by VCTRL<0> at this level consistent with VFB, while P<1:7> is always 0, VCTRL<1:7> is also always 0, and corresponding NMOS transistors NM2-NM8 remain in a cut-off state, which do not influence the voltage dividing resistor string. Situations corresponding to other code values can be deduced by analogy.

Voltage detection point design is performed on the voltage detector structure provided in the embodiment of the present application and the voltage detector structure corresponding to FIG. 3 in which a single feedback signal controls a single lower voltage dividing resistor. The results are as shown in Table 1.

When the resistors all participate in dividing the voltage, the corresponding detection voltage is the voltage fall detection point. At this time, the two structures can be consistent, and the design target error is small.

Under the condition of multiple levels, the different settings of the lower voltage dividing resistors will cause a significant difference in the voltage rise detection point. When only one lower voltage dividing resistor is used in the original structure, with the increase of the level, the voltage rise detection point will deviate greatly from the design target. The deviation may exceed 200 mV under typical conditions. The improved structure provided in the embodiment of the present application can precisely set the lower voltage dividing resistors at different levels through a simple series-parallel mode to achieve the accurate control of the detection point, and the voltage window can be controlled at 100 mV±1%, as shown in Table 1 below.

In Table 1, the levels are represented by control codes, which respectively represent the first to eighth levels. The design targets are the target values of the voltage rise detection point and the voltage fall detection point. The existing structure is the resistor string structure illustrated in FIG. 3; the structure according to the embodiment of the present application is the structure corresponding to FIG. 4 and FIG. 5.

It can be seen that the voltage fall detection point of the existing structure and the voltage fall detection point of the structure according to the embodiment of the present application are consistent, both of which are not greatly different from the voltage fall detection point of the design target. However, compared with the existing structure, the embodiment of the present application realizes the adjustment of the voltage rise detection point, and with the increase of the level, the adjustment range of the voltage rise detection point increases according to the embodiment of the present application, which will make the decreased value of the voltage rise detection point in the embodiment of the present application increase on the basis of the voltage rise detection point in the existing structure, which just sets off the increasing deviation between the voltage rise detection point of the existing structure and the voltage rise detection point of the design target, so that the voltage rise detection point of the embodiment of the present application is consistent with the voltage rise detection point of the design target, thus making the voltage window remain constant. In Table 1, the voltage window is controlled at 100 mV±1%. The voltage window of the eighth level of the existing structure is more than 293 mv.

The resistor string structure according to the embodiment of the present application is equivalent to dividing the resistor R209 in FIG. 3, and the lower voltage dividing resistors of different levels are adjusted in a progressive way, thus adding no new resistors, reducing the area and effectively improving the utilization rate of the resistors.

In the embodiment of the present application, a method for calculating the resistance of the lower voltage dividing resistors of different levels is as follows:

It is set that the voltage rise detection point corresponding to the <000> code is $V_{r0}$ and the voltage fall detection point is $V_{f0}$.

A formula for calculating the voltage rise detection point is:

TABLE 1

| Level | Design target | | Existing structure | | | Structure according to the embodiment of the present application | | |
|---|---|---|---|---|---|---|---|---|
| | Voltage rise detection point (V) | Voltage fall detection point (V) | Voltage rise detection point (V) | Voltage fall detection point (V) | Voltage window (mV) | Voltage rise detection point (V) | Voltage fall detection point (V) | Voltage window (mV) |
| <000> | 2.04 | 1.94 | 2.045 | 1.94 | 105 | 2.041 | 1.94 | 101 |
| <001> | 2.19 | 2.09 | 2.214 | 2.09 | 124 | 2.19 | 2.09 | 100 |
| <010> | 2.34 | 2.24 | 2.39 | 2.241 | 149 | 2.34 | 2.241 | 99 |
| <011> | 2.49 | 2.39 | 2.565 | 2.392 | 173 | 2.491 | 2.392 | 99 |
| <100> | 2.64 | 2.54 | 2.744 | 2.543 | 201 | 2.642 | 2.543 | 99 |
| <101> | 2.79 | 2.69 | 2.921 | 2.691 | 230 | 2.791 | 2.691 | 100 |
| <110> | 2.94 | 2.84 | 3.1 | 2.84 | 260 | 2.941 | 2.84 | 101 |
| <111> | 3.09 | 2.99 | 3.28 | 2.987 | 293 | 3.087 | 2.987 | 100 |

$$VBGL = V_{ro} * \frac{R1 + \ldots + R8}{R0 + \ldots + R8} \quad (3)$$

At this time, the resistors below the resistor R8 are all short-circuited.

A formula for calculating the voltage fall detection point is:

$$VBGL = V_{fo} * \frac{R1 + \ldots + R8 + R1' + \ldots + R8'}{R0 + \ldots + R8 + R1' + \ldots + R8'} \quad (4)$$

At this time, the resistors below the resistor R8 all participate in dividing the voltage.

The total number of resistors required may be calculated firstly according to the voltage fall detection point, and then the resistance of the lower voltage dividing resistors may be calculated according to the target value of the voltage rise detection point.

When the level is <000>, the voltage rise detection point is the lowest, and the required resistance of the lower voltage dividing resistors is the largest. R1' is the difference between the resistance of the lower voltage dividing resistor required by the level <000> and the resistance of the lower voltage dividing resistor required by the level <001>, and R2' is the difference between the resistance of the lower voltage dividing resistor required by the level <001> and the resistance of the lower voltage dividing resistor required by the level <010>. In this way, the resistors R1' and R2' to R8' can be obtained by calculating the resistance of the lower voltage dividing resistors of each level and the difference between the resistance of the lower voltage dividing resistors of each level. In this way, the maximum utilization of the resistors can be realized by arranging the resistors in series by difference.

By finely adjusting the lower voltage dividing resistors of each level, the accurate control of the multi-level voltage rise and fall detection points can be realized, thus ensuring the voltage window is fixed. The output of each level is compared by the comparator with the voltage of the specific level selected by the gating module to generate a result, and finally a logic signal is output.

By introducing "AND logic operation" into the overall circuit, i.e., the logic AND circuit 210, the synchronization of the feedback signal and the control signal is realized. When the input selection signal is 1, the change of VFB determines the change of the control signal of the switch transistor. The VFB feedback state can be accurately mapped to the control switch transistors of the lower voltage dividing resistors of each level, thus distinguishing the voltage window of each level.

The embodiment of the present application does not introduce additional control PIN and ensures the accurate realization of the multi-level voltage detector function. Based on this structure, adjusting the resistance ratio can achieve the effect that the error between the voltage rise and fall detection points of different levels is less than 1%.

The voltage detector structure provided by the embodiment of the present application has been verified through Virtuoso simulation and can be applied to VDs in the core voltage domain and the input/output (ID) voltage domain. The voltage detector range of the former is 0.75V-0.95V, and the voltage detector range of the latter is 1.9V-3.1V. CMOS transistors with different voltage domains can control the error of the detection voltage within 1% in different voltage detector ranges. The accurate control of voltage detection point and fixed voltage window is realized. At the same time, the circuit structure is expandable and can be applied to multiple platforms at present.

The present application has been described in detail through the specific embodiments above, which, however, do not constitute limitations to the present application. Without departing from the principle of the present application, those skilled in the art may make many changes and improvements, which should also be considered as falling within the scope of protection of the present application.

What is claimed is:

1. A multi-level voltage detector circuit, wherein the multi-level voltage detector circuit comprises a voltage dividing circuit, wherein the voltage dividing circuit outputs n levels of divisional voltages of a power supply voltage;
   wherein the voltage dividing circuit comprises a first resistor string and a second circuit;
   wherein the first resistor string is formed by n+1 voltage dividing resistors connected in series, wherein a first end of a zeroth voltage dividing resistor is connected to the power supply voltage, wherein a first end of a kth voltage dividing resistor is connected to a second end of an (k−1)th voltage dividing resistor, and wherein the first end of the kth voltage dividing resistor outputs a kth divisional voltage, wherein 1≤k≤n; wherein a second end of an nth voltage dividing resistor is connected to the second circuit;
   wherein the second circuit provides n lower voltage dividing resistors;
   wherein a kth lower voltage dividing resistor provides a kth rise detection point and a kth fall detection point of the power supply voltage, wherein the kth fall detection point is less than the kth rise detection point, and wherein a difference between the kth rise detection point and the kth fall detection point is a kth voltage window;
   wherein when the kth rise detection point is detected, the second circuit provides a kth lower voltage dividing resistor and short-circuits the kth lower voltage dividing resistor; and
   when the kth fall detection point is detected, the second circuit provides the kth lower voltage dividing resistor to a position between a second end of the nth voltage dividing resistor and a ground; and as a value of k increases, a resistance of the kth lower voltage dividing resistor decreases, so that a voltage window of each divisional voltage is fixed.

2. The multi-level voltage detector circuit according to claim 1, wherein the second circuit comprises a switch network, wherein the second circuit uses the switch network to provide the kth lower voltage dividing resistor and set an electrical connection structure of the kth lower voltage dividing resistor.

3. The multi-level voltage detector circuit according to claim 2, wherein the second circuit further comprises a second resistor string formed by n second resistors connected in series;
   wherein a first end of a first second resistor is connected to the second end of the nth voltage dividing resistor;
   wherein a first end of an mth second resistor is connected to a second end of an (m−1)th second resistor, wherein 1≤m≤n;
   wherein a second end of an nth second resistor is connected to the ground; and wherein the resistance of the kth lower voltage dividing resistor is a sum of the resistance of a kth second resistor to a nth second resistor.

4. The multi-level voltage detector circuit according to claim 3, wherein the switch network comprises n switches and wherein the switch network controls each switch through an n-bit control signal;
  wherein a kth switch is connected between a first end of the kth second resistor and the ground;
  wherein the kth switch is controlled through a (k−1)th-bit control signal;
  wherein when the second circuit selects the kth lower voltage dividing resistor, a first to (k−1)th switches and (k+1)th to nth switches are turned off;
  wherein when the kth rise detection point is detected, the kth switch is turned on, and the first to (k−1)th switches and the (k+1)th to nth switches are turned off; and
  wherein when the kth fall detection point is detected, the n switches are all turned off.

5. The multi-level voltage detector circuit according to claim 4, wherein all switches are either NMOS transistor switches or PMOS transistor switches.

6. The multi-level voltage detector circuit according to claim 4, wherein the multi-level voltage detector circuit further comprises a multiplexer and a comparator;
  wherein the multiplexer comprises at least n input ends, wherein each divisional voltage is connected to one input end of the multiplexer, and an output end of the multiplexer outputs a selected divisional voltage;
  wherein a first input end of the comparator is connected to the output end of the multiplexer;
  wherein a second input end of the comparator is connected to a reference voltage; and
  wherein an output end of the comparator outputs a first feedback signal.

7. The multi-level voltage detector circuit according to claim 6, wherein the first input end of the comparator is a positive-phase input end and wherein the second input end of the comparator is a negative-phase input end; and wherein the output end of the comparator is further connected to an input end of a phase inverter, and an output end of the phase inverter outputs a second feedback signal.

8. The multi-level voltage detector circuit according to claim 7, wherein the multi-level voltage detector circuit further comprises a decoder, wherein an input end of the decoder is connected to an externally input control code, wherein an output end of the decoder outputs an n-bit selection signal, wherein the n-bit control signal is obtained by performing a logic operation on the n-bit selection signal, the first feedback signal, or the second feedback signal.

9. The multi-level voltage detector circuit according to claim 8, wherein when all switches are NMOS switches, in a case that the kth lower voltage dividing resistor is selected, a kth-bit selection signal in the n-bit selection signal is 1, a first-bit to (k−1)th-bit and (k+1)th-bit to nth-bit selection signals are all 0; and
  wherein the n-bit control signal is obtained by performing logic multiplication on the n-bit selection signal and the second feedback signal.

10. The multi-level voltage detector circuit according to claim 9, wherein when all switches are PMOS switches, in a case that the kth lower voltage dividing resistor is selected, the kth-bit selection signal in the n-bit selection signal is 0, the first-bit to (k−1)th-bit and (k+1)th-bit to nth-bit selection signals are all 1; and
  wherein the n-bit control signal is obtained by performing logic addition on the n-bit selection signal and the first feedback signal.

* * * * *